United States Patent
Ku et al.

(10) Patent No.: US 10,070,512 B2
(45) Date of Patent: *Sep. 4, 2018

(54) MULTILAYER CIRCUIT BOARD

(71) Applicant: MPI corporation, Hsinchu County (TW)

(72) Inventors: Wei-Cheng Ku, Hsinchu County (TW); Jun-Liang Lai, Hsinchu County (TW); Chih-Hao Ho, Hsinchu County (TW)

(*) Notice: Subject to any disclaimer, the term of this patent is extended or adjusted under 35 U.S.C. 154(b) by 21 days.

This patent is subject to a terminal disclaimer.

(21) Appl. No.: 15/423,584

(22) Filed: Feb. 3, 2017

(65) Prior Publication Data

US 2017/0150592 A1    May 25, 2017

Related U.S. Application Data

(62) Division of application No. 14/620,015, filed on Feb. 11, 2015, now Pat. No. 9,596,769.

(51) Int. Cl.
*H05K 1/02* (2006.01)
*H05K 1/11* (2006.01)
*H05K 1/18* (2006.01)

(52) U.S. Cl.
CPC ........... *H05K 1/0216* (2013.01); *H05K 1/113* (2013.01); *H05K 1/114* (2013.01); *H05K 1/18* (2013.01); *H05K 2201/041* (2013.01); *H05K 2201/09545* (2013.01)

(58) Field of Classification Search
CPC ............. H05K 1/0216; H05K 1/113; H05K 2201/041; H05K 2201/09545
See application file for complete search history.

(56) References Cited

U.S. PATENT DOCUMENTS

| | | | | |
|---|---|---|---|---|
| 4,837,408 A * | 6/1989 | Kondo | ................ | C03C 17/008 156/89.18 |
| 7,791,898 B2 * | 9/2010 | Peytavy | ................ | G06F 21/86 361/792 |
| 8,476,535 B2 * | 7/2013 | Sahara | ................ | H05K 1/186 174/254 |
| 9,596,769 B2 * | 3/2017 | Ku | ................ | H05K 3/426 |

* cited by examiner

Primary Examiner — Ishwarbhai B Patel

(57) ABSTRACT

A multilayer circuit board includes a first substrate and a second substrate in stack. The first substrate is provided with two first pads, two second pads, and two first sub-circuits. The first pads and the second pads are electrically connected to the first sub-circuits. The second substrate has a top surface, a bottom surface, a lateral edge, and two openings. The bottom surface of the second substrate is attached to the top surface of the first substrate. The openings extend from the top surface to the bottom surface of the second substrate. The first pads of the first substrate are in the opening of the second substrate; the second pads of the first substrate are not covered by the second substrate. The second substrate is further provided with a pad on the top surface and a second sub-circuit electrically connected to the pad of the second substrate.

8 Claims, 8 Drawing Sheets

MULTILAYER CIRCUIT BOARD

RELATED APPLICATION INFORMATION

This application is a divisional of co-pending U.S. patent application Ser. No. 14/620,015 filed on Feb. 11, 2015, incorporated herein by reference in its entirety.

BACKGROUND OF THE INVENTION

Field of the Invention

The present invention relates to a circuit board, and more particularly to a multilayer circuit board.

Description of Related Art

FIG. 1 shows a conventional multilayer circuit board 1, including a plurality of substrates 10 with several plated through holes 12. Electronic components (not shown) are provided on exterior surfaces of the top and the bottom substrates. The top substrate 10 is provided with a plurality of pads 102 for a specific device, such as wires or probes (not shown), to conduct an electrical connection. Each substrate 10 has a sub-circuit 104, and the plated through holes 12 conduct electrical connections of the sub-circuits 104 form a circuit.

The substrates 10 have to be precisely positioned in the lamination process for aligning the through holes 12. However, the precise alignment is harder when there are more substrates in the multilayer circuit board. Therefore, the yield rate of making the multilayer circuit boards is low. In addition, the signal transmission in the plated through holes 12 might be interfered while there are traces (shown by dot lines in FIG. 1) around the through holes 12. Typically, the plated through hole 12 includes an effective section 12a, which is between the sub-circuit and the pad for signal transmission between the sub-circuit and the pad, and a null section 12b, which is under the sub-circuit and transmits no signal. The effective sections 12a of the plated through hole 12 will be longer while there are more substrates, and the alignment problem will be more significant. However, there usually are parasitic capacitances and parasitic inductances in the null sections 12b. So, the signal interference problem will be more serious while null sections 12b are longer.

Furthermore, the pads 102 usually are provided on the same surface of the multilayer circuit board 1. It is easy to understand that the pads 102 take a space of the surface, and there will be less space for the traces while there are more pads 102 on the surface, and that might be a problem of insufficient traces to connect to all the pads 102.

The above and other objects, features and advantages of the invention will become apparent from the following detailed description taken with the accompanying drawings.

SUMMARY OF THE INVENTION

In view of the above, the primary objective of the present invention is to provide a multilayer circuit board, which may reduce the distance of signal transmission between the pads and the traces to increase the capacity of signal transmission and the yield rate of making the multilayer circuit boards.

The secondary objective of the present invention is to provide a multilayer circuit board, which has a surface larger than the prior art.

In order to achieve the objectives of the present invention, a multilayer circuit board includes a first substrate and a second substrate in stack. The first substrate is provided with a first pad, a second pad, and a first sub-circuit, wherein the first pad and the second pad are electrically connected to the first sub-circuit, and provided on a top surface of the first substrate. The second substrate has a top surface, a bottom surface, a lateral edge, and an opening. The bottom surface of the second substrate is attached to the top surface of the first substrate. The opening extends from the top surface to the bottom surface of the second substrate. The first pad of the first substrate is in the opening of the second substrate; the second pad of the first substrate is beside the lateral edge of the second substrate, and is not covered by the second substrate. The second substrate further provided with a pad on the top surface and a second sub-circuit electrically connected to the pad of the second substrate.

The present invention provides the pads on each substrate. Using the height difference caused by the substrates, the pads are kept with sufficient distances from each other in a small board to reduce the interference problem in signal transmission and increase the yield rate of making the multilayer circuit board.

These and other objectives of the present disclosure will no doubt become obvious to those of ordinary skill in the art after reading the following detailed description of the preferred embodiment that is illustrated in the various figures and drawings.

DETAILED DESCRIPTION OF THE INVENTION

Figure 1:
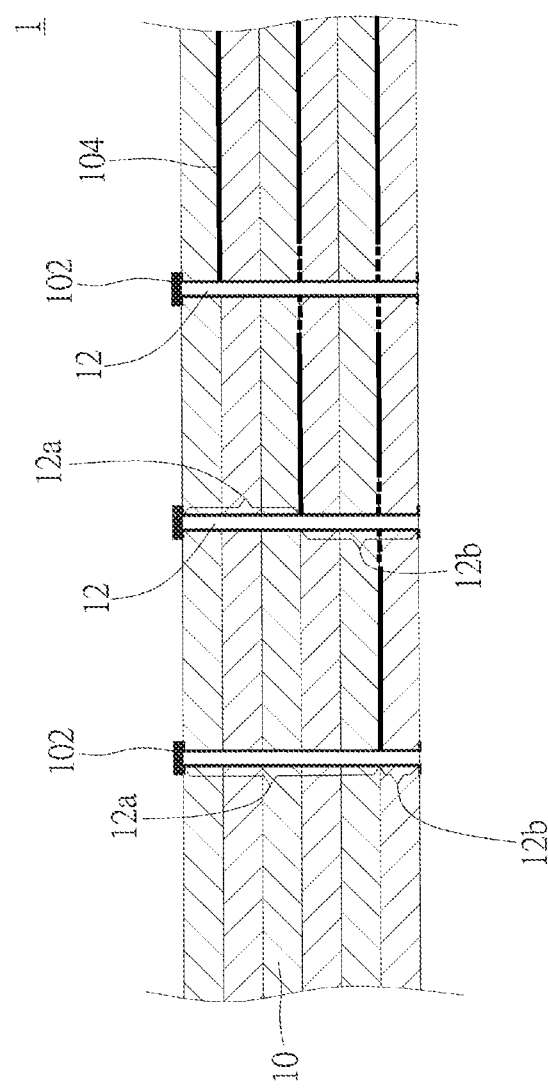
FIG. 1 is a sectional view of the conventional multilayer circuit board.
Figure 2:
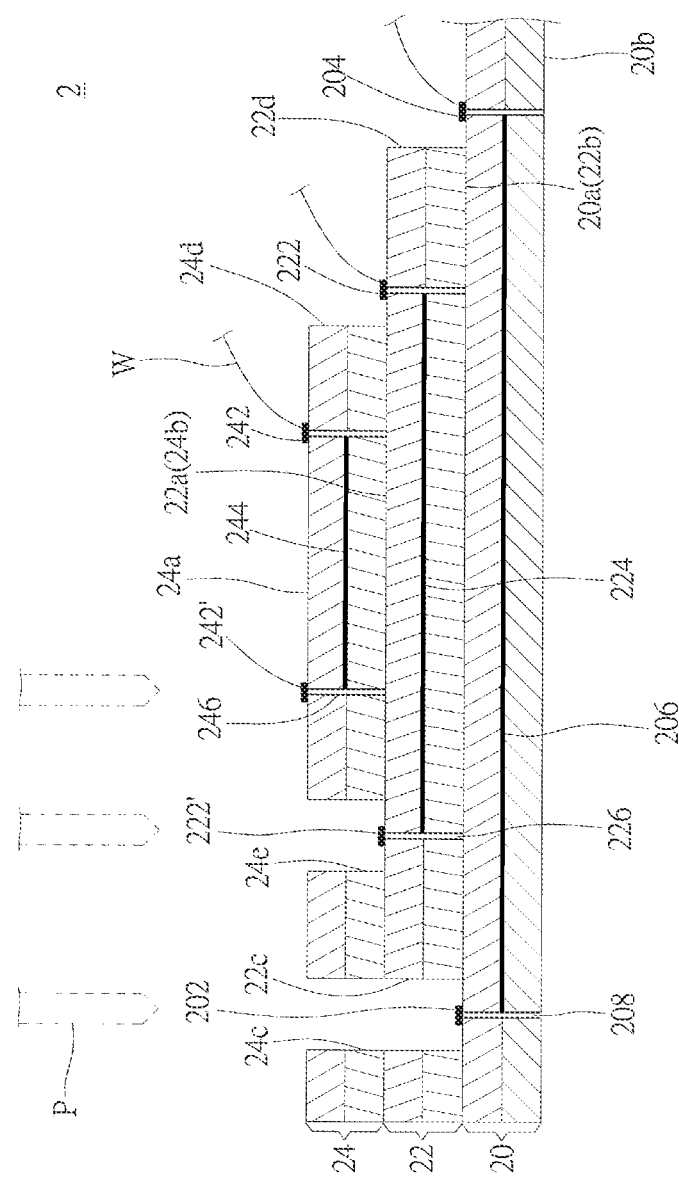
FIG. 2 is a sectional view of a first preferred embodiment of the present invention.

As shown in FIG. 2, a multilayer circuit board 2 of the first preferred embodiment of the present invention includes a first substrate 20 and two second substrates 22, 24. The first substrate 20 and the second substrates 22, 24 each have two laminates.

The first substrate 20 has a top surface 20a and a bottom surface 20b. The first substrate 20 is provided with a first pad 202 and a second pad 204 on the top surface 20a. The first substrate 20 is provided with a first sub-circuit 206 between the laminates, which means that the first sub-circuit 206 is embedded in the first substrate 20, and two plated through holes 208 electrically connected to the first pad 202 and the second pad 204 respectively.

The second substrate 22 is stacked on the first substrate 20, and the other second substrate 24 is stacked the second substrate 22. Each second substrate 22, 24 has a top surface 22a, 24a, a bottom surface 22b, 24b, an opening 22c, 24c, and a lateral edge 22d, 24d. The bottom surface 22b of the second substrate 22 is attached to the top surface 20a of the first substrate 20, and the top surface 22a of the second substrate 22 is attached to the bottom surface 24b of the second substrate 24. The opening 22c of the second substrate 22 is aligned with the opening 24c of the second substrate 22 to form a through hole of the second substrates 22, 24 and expose a portion of the top surface 20a of the first substrate 20 where the first pad 202 is provided. In other words, the first pad 202 is received in the opening 24c. The second substrate 22 is smaller than the first substrate 20, and the second pad 204 of the first substrate 20 is beyond the lateral edge 22d of the second substrate 22, which means that the second pad 204 is not covered by the second substrate 22. The second substrate 24 is provided with two pads 222, 222' and a second sub-circuit 224 electrically connected to the pads 222, 222'. The second substrate 24 is smaller than the second substrate 22, and the pad 222 is beyond the lateral edge 24d of the second substrate 24, which means that the pad 222 is not covered by the second substrate 24, or the pad 222 is between the lateral edges 22d, 24d of the second substrates 22, 24.

The second substrate 24 further is provided with an opening 24e, which exposes a portion of the top surface 22a of the second substrate 22 and the pad 222'. The second substrate 24 further is provided with two pads 242, 242' on the top surface 22a, a second sub-circuit 244, and two plated through holes 246. The second sub-circuit 244 is electrically connected to the pads 242, 242' through the plated through holes 246.

It is easy to understand that the multilayer circuit board 2 of the present invention has six pads 202, 204, 222, 222', 242, and 242', two of which 202, 204 are on the first substrate 20, another two of which are on the second substrate 22, and the rest two of which are on the second substrate 24. With the height difference caused by the substrates 20, 22, and 24, the pads 202, 204, 222, 222', 242, and 242' are kept with sufficient distances from each other in a small board to reduce the interference problem in signal transmission. It is noted that probes P have to be inserted into the openings 22c, 24c, 24e respectively to touch the pads 202, 222' therein.

With different lengths of the substrates 20, 22, and 24, the substrates 20, 22 each have an exposed region at a margin thereof, which are not covered by the above substrates 22, 24. The pads 204, 222 on the exposed regions of the substrates 20, 22 may be connected to wires W. With the height difference, it may reduce the interference problem, or connect more wires to the multilayer circuit board 2.

Figure 3:
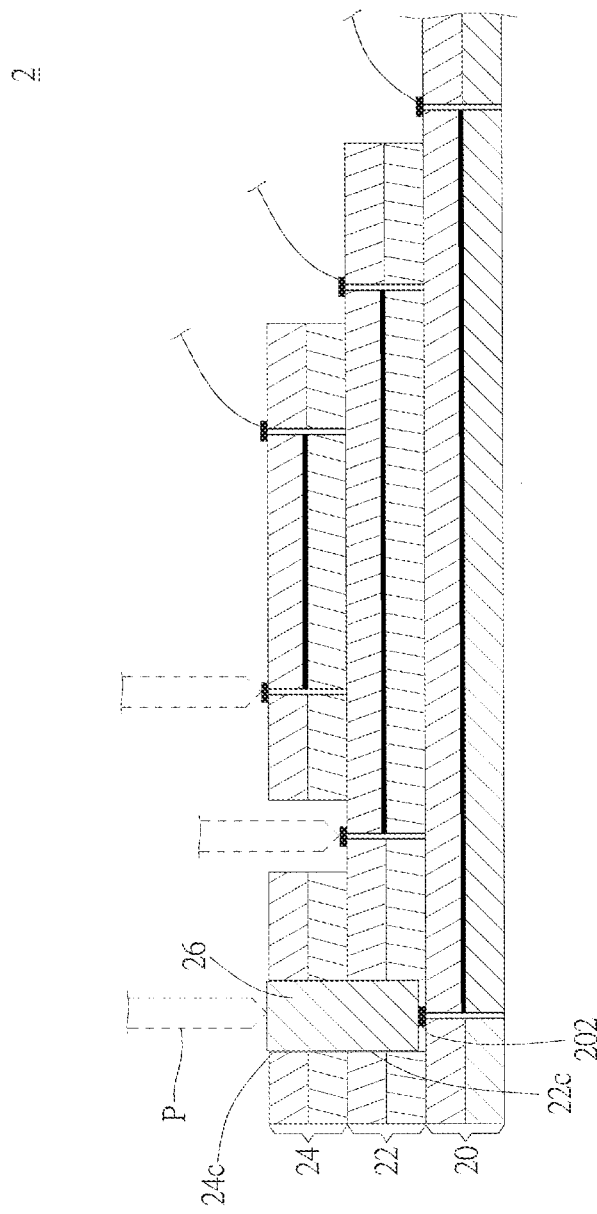
FIG. 3 is a sectional view of the first preferred embodiment of the present invention, showing the first type of the conductor.

As shown in FIG. 3, the multilayer circuit board 2 further is provided with a conductor 26 received in the openings 22c, 24c of the substrate 22, 24 to touch the pad 202. A top end of the conductor 26 is about even with the top surface 24a of the second substrate 24. The probe P can touch the conductor 26 instead of the pad 202 in the openings 22c, 24c.

Figure 4:
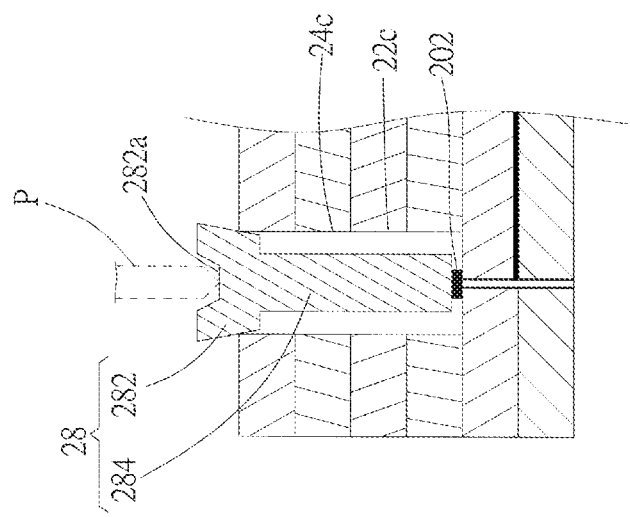
FIG. 4 is a sectional view of the first preferred embodiment of the present invention, showing the second type of the conductor.
Figure 5:
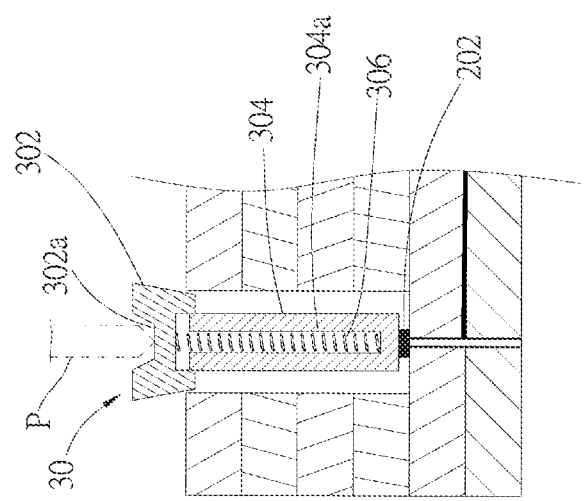
FIG. 5 is a sectional view of the first preferred embodiment of the present invention, showing the third type of the conductor.

FIG. 4 shows an alternate conductor 28, which includes a head 282 and a rod 284. The rod 284 has an end connected to the head 282, and an opposite end touching the pad 202. The head 282 is wider than the rod 284, and leans against a sidewall of the opening 24c of the second substrate 24 to hold the conductor 28 at a middle of the openings 22c, 24c. The head 282 further has a recess 282a on a top to receive a tip of the probe P. FIG. 5 shows another conductor 28, which includes a head 302, a rod 304, and an elastic member 306. The elastic member 306 is a spring here. The head 302 is provided with a recess 302a, and the rod 304 is provided with a hole 304a on an end to receive the spring 306. The rod 304 has an end, which is opposite to the hole 304, touching the pad 202 in the opening 22c, and the head 20 has a annular protrusion at a bottom received in the opening 24c, and rests against an end of the spring 306. As a result, the head 302 is urged by the spring 306 to provide the probe P a buffer when it moves downward to touch the head 302, and reduce the pressure of the probe P on the pad 202.

Figure 6:
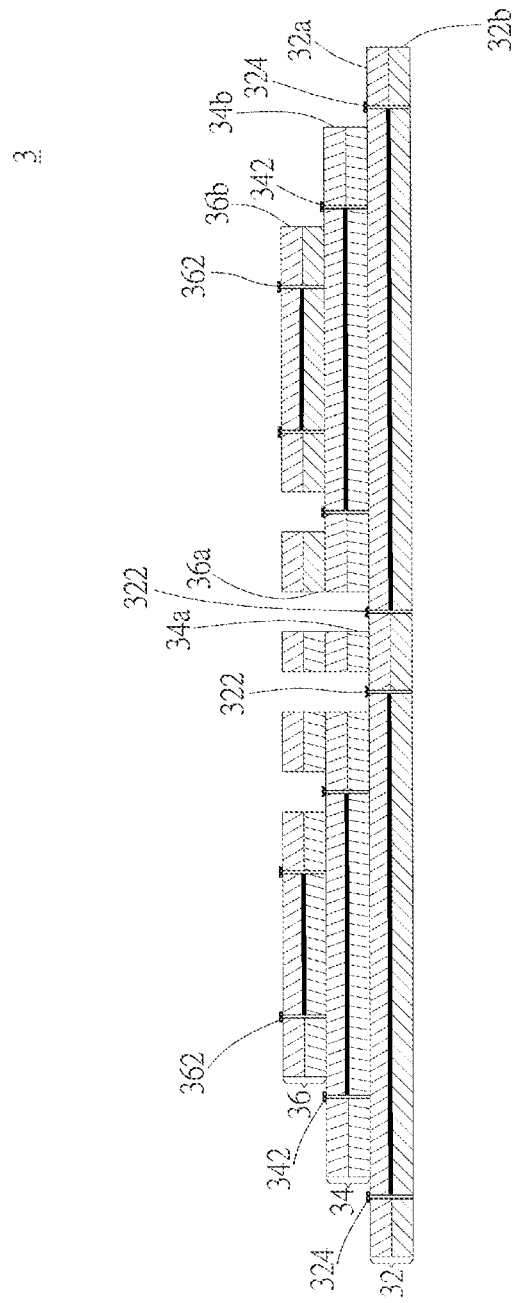
FIG. 6 is a sectional view of a second preferred embodiment of the present invention.

As shown in FIG. 6, a multilayer circuit board 3 of the second preferred embodiment of the present invention, which is similar to the first embodiment, and the different parts include a first substrate 32 with two first pads 322 and two second pads 324, wherein the first pads 322 are under openings 34a, 36a of two second substrates 34, 36, and the second pads 324 are on an exposed region of a top surface 32a of the first substrate 32, which is not covered by the second substrates 34, 36. The second substrate 36 is smaller than the second substrate 34, and the first substrate 32 is smaller than the second substrate 34, so that the first substrate 32 has an annular exposed region between lateral edges 32b, 34b of the first and the second substrates 32, 34, and the second substrate 34 has an annular exposed region between lateral edges 34b, 36b of the second substrates 34, 36. The second substrate 34 includes four pads 342, two of which are on the exposed region of the second substrate 36, and the other two of which are under two openings of the second substrate 36. The second substrate 36 includes four pads 362. The pads 324, 342, 362 beside the lateral edges 32b, 34b, 36b (on the exposed regions) of the substrates 32, 34, 36 are adapted to be connected to wires (not shown).

Figure 7:
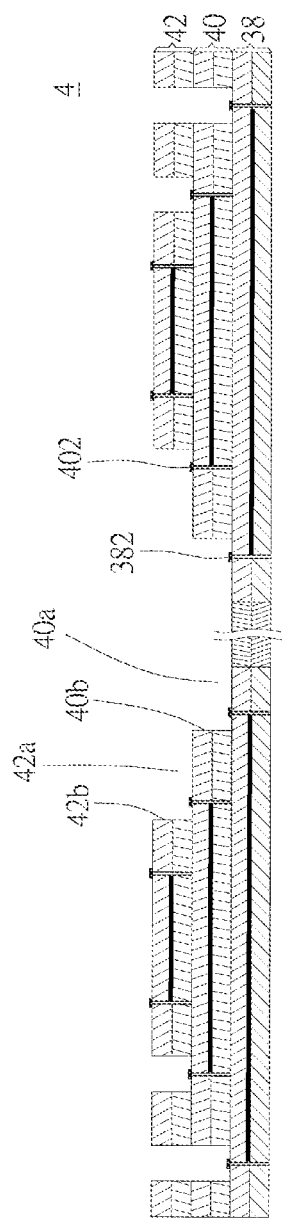
FIG. 7 is a sectional view of a third preferred embodiment of the present invention.

FIG. 7 shows a multilayer circuit board 4 of the third preferred embodiment of the present invention, which is similar to the first embodiment, except that all the substrates 38, 40, 42 have the same size. The second substrate 42, is provided with a hole 42a, and the second substrate 40 has a hole 40a under the hole 42a. The hole 42a of the second substrate 42 is bigger than the hole 40a of the second substrate 40. Therefore, the first substrate 38 has an exposed region under the hole 40a, and the second substrate 40 has an annular exposed region under the hole 42a and between lateral edges 40b, 42b of the second substrates 40, 42. The first substrate 38 is provided with two pads 382 on the exposed region thereof, and the second substrate 40 is provided with two pads 402 on the exposed region thereof. Wires (not shown) are connected to these pads 382, 402 at a middle of the multilayer circuit board 4.

Figure 8:
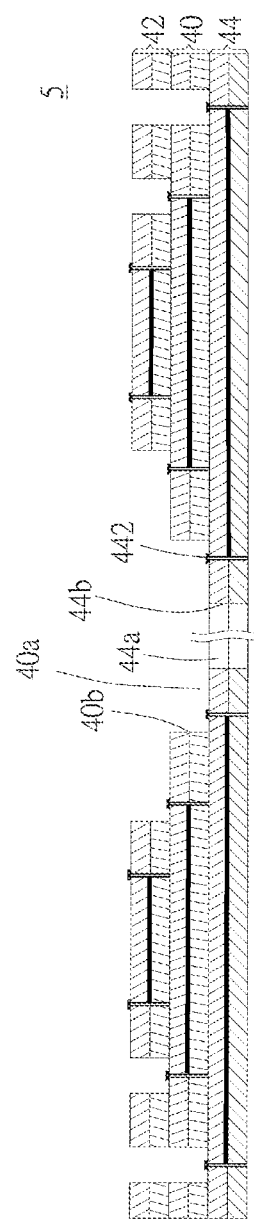
FIG. 8 is a sectional view of a fourth preferred embodiment of the present invention.

FIG. 8 shows a multilayer circuit board 5 of the fourth preferred embodiment of the present invention, which is similar to the multilayer circuit board 4 of the third embodiment, except that a first substrate 44 further is provided with a hole 44a under the hole 40a of the second substrate 40. An exposed region of the first substrate 44 is defined between a lateral edge 44b, which is a sidewall of the hole 44a of the first substrate 44, and the lateral edge 40 of the second substrate 40. Wires (not shown) may pass through the hole 44a of the first substrate 44 from a bottom of the multilayer circuit board 5 to be connected to the pads.

Figure 9:
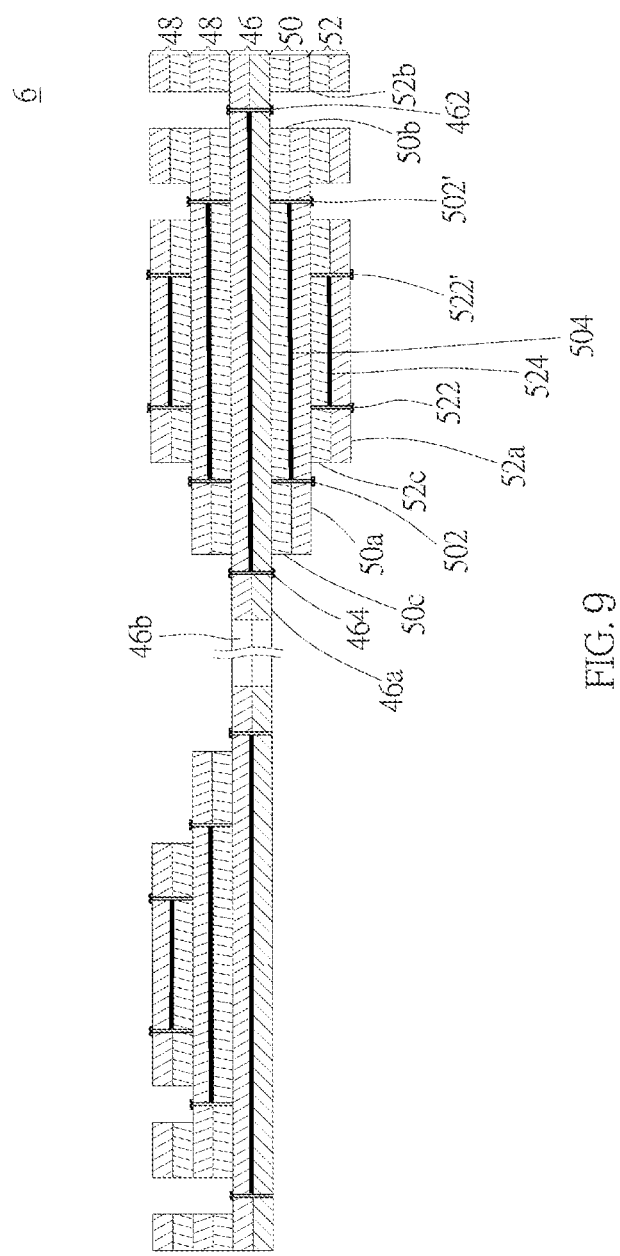
FIG. 9 is a sectional view of a fifth preferred embodiment of the present invention.

FIG. 9 shows a multilayer circuit board 6 of the fifth preferred embodiment of the present invention, which is similar to the multilayer circuit board 5 of the fourth embodiment, except that two third substrates 50, 52 in stack are attached to a bottom surface 46a of a first substrate 46. The first substrate 46 further has a third pad 462 and a fourth pad 464 on the bottom surface 46a, wherein the third pad 462 is on an exposed region on the bottom surface 46a of the first substrate 46. The same as second substrates 48, the third substrates 50, 52 each has two pads 502, 502', 522, 522' on bottom surfaces 50a, 52 a thereof, wherein the pad 502 is on the exposed region of the third substrate 50, and the pad 502' is under an opening of the third substrate 52.

The third substrate 50 is bigger than the third substrate 52, so that the third substrate 50 has an exposed region between lateral edges 50c, 52c of the third substrates 50, 52, and the pad 502 is provided on the exposed portion. The fourth pad 464 of the first substrate 46 is beyond the lateral edge 50c of the third substrate 50, and not covered by the third substrates 50, 52. The other pad 502' of the third substrate 50 is under the opening 52d of the third substrate 52. As a result, wires (not shown) of the first and the second substrate 46, 48 could pass the opening 46b of the first substrate 46, and be connected to the pads 502, 522 of the third substrates 50, 52.

In the embodiments of above, each substrate has two laminates and the sub-circuit is provided between the laminates, and the plated through holes, to which the pads are connected, extend through both the laminates only, which means that these plated through holes is in one substrate only, and that minimizes the lengths of these plated through holes to reduce the interference problem and the parasitic capacitance and inductance problem. In practice, it would provide one or more than two second and third substrates in the multilayer circuit board.

Figure 10:
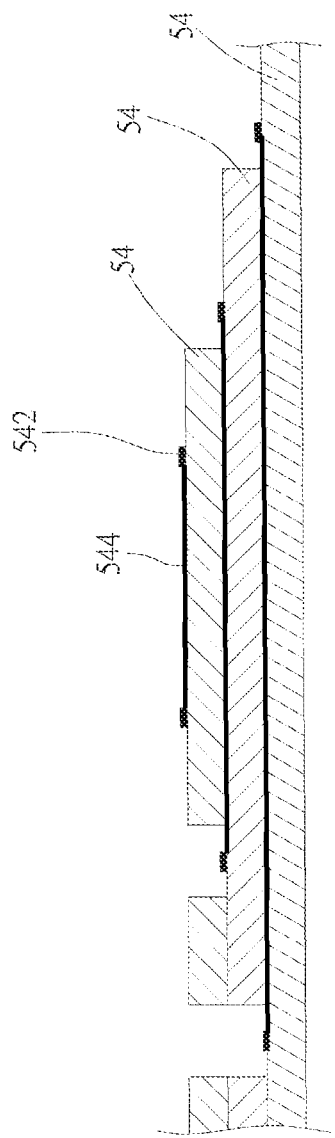
FIG. 10 is a sectional view of a sixth preferred embodiment of the present invention.

FIG. 10 shows a multilayer circuit board 7 of the sixth preferred embodiment of the present invention, in which each substrate 54 is provided with a sub-circuit 544 on a top surface thereof instead of embedded in the substrate. Each substrate 54 further has pads 542 on the top surface directly electrically connected to the sub-circuit 544. It is easy to understand that no plated through hole is needed in the multilayer circuit board 7. Such substrate may be applied in the above embodiments.

In conclusion, the multilayer circuit board may shorten the distances between the pad and the sub-circuit, and furthermore, no plated through hole extends through two or more substrates that could avoid the alignment problem to increase the yield rate of making the multilayer circuit boards. Even for the substrate with an embedded sub-circuit, the length of the plated through hole is short enough to avoid the above problem. With the height difference design in the multilayer circuit board of the present invention, it may provide more pads and sub-circuit on the multilayer circuit board.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A multilayer circuit board, comprising:
a first substrate provided with two first pads, two second pads, and two first sub-circuits, wherein the first pads are electrically connected to the first sub-circuits via one group of plated through holes and the second pads are electrically connected to the first sub-circuits via another group of plated through holes, the first pads and the second pads are provided on a top surface of the first substrate, and the first sub-circuit is embedded in the first substrate; and
a second substrate having a top surface, a bottom surface, a lateral edge, and two openings, wherein the bottom surface of the second substrate is attached to the top surface of the first substrate; the openings extend from the top surface to the bottom surface of the second substrate, and the first pads of the first substrate are in the opening of the second substrate; the second pads of the first substrate are beside the lateral edge of the second substrate, and are not covered by the second substrate; the second substrate is further provided with two pads on the top surface and a second sub-circuit electrically connected to the pads of the second substrate;
wherein the second substrate is smaller than the first substrate; the second pads of the first substrate are beyond the lateral edge of the second substrate.

2. The multilayer circuit board of claim 1, wherein the two second pads are on the top surface and beside two opposite sides of the lateral edge of the first substrate, respectively.

3. The multilayer circuit board of claim 2, further comprising another second substrate attached to the top surface of the second substrate, wherein an exposed region is between the lateral edge of the second substrates and a lateral edge of the another second substrate.

4. The multilayer circuit board of claim 3, wherein the two pads of the second substrate are between the lateral edge of the second substrates and the lateral edge of the another second substrate.

5. The multilayer circuit board of claim 4, wherein the another second substrate provided with two pads and the two pads are beside the lateral edge of the another second substrate.

6. The multilayer circuit board of claim 1, further comprising a conductor received in the opening of the second substrate, wherein a bottom end of the conductor touches the first pad of the first substrate.

7. The multilayer circuit board of claim 6, wherein the conductor is provided with a recess on a top end thereof.

8. The multilayer circuit board of claim 7, wherein the conductor includes a head, a rod, and an elastic member; the head is provided with the recess; the rod touches the first pad of the first substrate; and the elastic member has opposite ends urging the head and the rod respectively.

\* \* \* \* \*